US012646160B2

(12) United States Patent
Eitan et al.

(10) Patent No.: US 12,646,160 B2
(45) Date of Patent: Jun. 2, 2026

(54) POST-PLASMA CLEAN INFRARED IMAGE INSPECTION FOR OXIDELESS BONDING AND APPARATUS FOR EFFECTING THE SAME

(71) Applicant: Taiwan Semiconductor Manufacturing Company Limited, Hsinchu (TW)

(72) Inventors: Amram Eitan, Hsinchu (TW); Jen-Hao Liu, Zhunan Township (TW); Chih-Yuan Chiu, Zhudong Township (TW); Hui-Ting Lin, Tainan (TW); Chi-Chun Peng, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 452 days.

(21) Appl. No.: 18/343,806

(22) Filed: Jun. 29, 2023

(65) Prior Publication Data

US 2025/0006690 A1 Jan. 2, 2025

(51) Int. Cl.
*G06T 7/00* (2017.01)
*H10P 70/00* (2026.01)
(Continued)

(52) U.S. Cl.
CPC ........... *G06T 7/0004* (2013.01); *H10P 70/30* (2026.01); *H10P 74/203* (2026.01);
(Continued)

(58) Field of Classification Search
CPC ......... G06T 7/0004; G06T 2207/10048; G06T 2207/30148; H10P 70/30; H10P 74/203;
(Continued)

(56) References Cited

U.S. PATENT DOCUMENTS

2006/0102847 A1* 5/2006 Shelley .................. G01J 3/443
250/372
2017/0005018 A1* 1/2017 De Wolf ................ H10P 74/23
(Continued)

FOREIGN PATENT DOCUMENTS

CN        105097427 A  * 11/2015
CN        107533014 A      1/2018
(Continued)

OTHER PUBLICATIONS

TW Patent and Trademark Office; TW Application No. 112130620; Office Action mailed Mar. 26, 2024; 8 pages.

*Primary Examiner* — Norman D Richards
*Assistant Examiner* — Laura M Dykes
(74) *Attorney, Agent, or Firm* — The Marbury Law Group, PLLC

(57) ABSTRACT

A bonded assembly may be formed by performing a chip plasma clean process on a semiconductor chip; generating at least one chip infrared image of a cleaned side of the semiconductor chip; measuring an average emissivity of at least one metallic region in the at least one chip infrared image; performing a subsequent processing step selected from a bonding step and an alternative processing step based on the measured average emissivity. The bonding step is performed if the measured average emissivity is less than a predetermined emissivity threshold value. The alternative processing step is performed if the measured average emissivity is greater than the predetermined emissivity threshold value. The alternative processing step may be selected from an additional clean step and an additional inspection step.

20 Claims, 11 Drawing Sheets

(51) Int. Cl.
 _H10P 74/20_         (2026.01)
 _H10W 72/00_         (2026.01)

(52) U.S. Cl.
 CPC .............. _G06T 2207/10048_ (2013.01); _G06T 2207/30148_ (2013.01); _H10W 72/07118_ (2026.01); _H10W 72/07183_ (2026.01); _H10W 72/07211_ (2026.01); _H10W 72/07232_ (2026.01); _H10W 72/07236_ (2026.01)

(58) Field of Classification Search
 CPC ........... H10P 72/06; H10W 72/07118; H10W 72/07183; H10W 72/07211; H10W 72/07232; H10W 72/07236
 USPC .......................................................... 438/15
 See application file for complete search history.

(56)                 References Cited

U.S. PATENT DOCUMENTS

| | | | |
|---|---|---|---|
| 2019/0172964 A1 | 6/2019 | Hermes et al. | |
| 2024/0404988 A1 * | 12/2024 | Huang ................ | H01J 37/3244 |

FOREIGN PATENT DOCUMENTS

| | | | |
|---|---|---|---|
| JP | 2949608 B2 * | 9/1999 | |
| TW | 201227843 A | 7/2012 | |

* cited by examiner

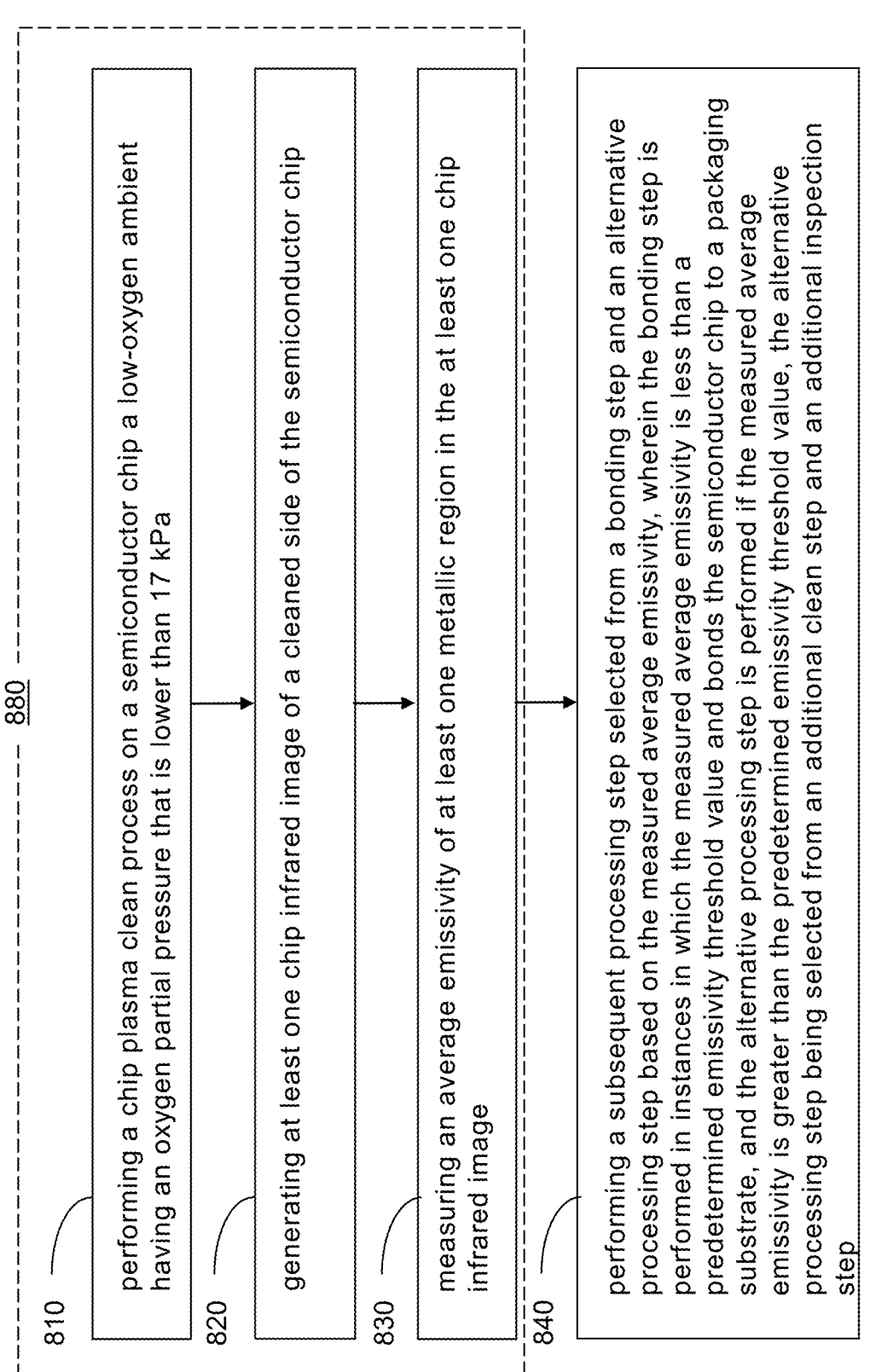

880

810 performing a chip plasma clean process on a semiconductor chip a low-oxygen ambient having an oxygen partial pressure that is lower than 17 kPa 820 generating at least one chip infrared image of a cleaned side of the semiconductor chip 830 measuring an average emissivity of at least one metallic region in the at least one chip infrared image 840 performing a subsequent processing step selected from a bonding step and an alternative processing step based on the measured average emissivity, wherein the bonding step is performed in instances in which the measured average emissivity is less than a predetermined emissivity threshold value and bonds the semiconductor chip to a packaging substrate, and the alternative processing step is performed if the measured average emissivity is greater than the predetermined emissivity threshold value, the alternative processing step being selected from an additional clean step and an additional inspection step

FIG. 8

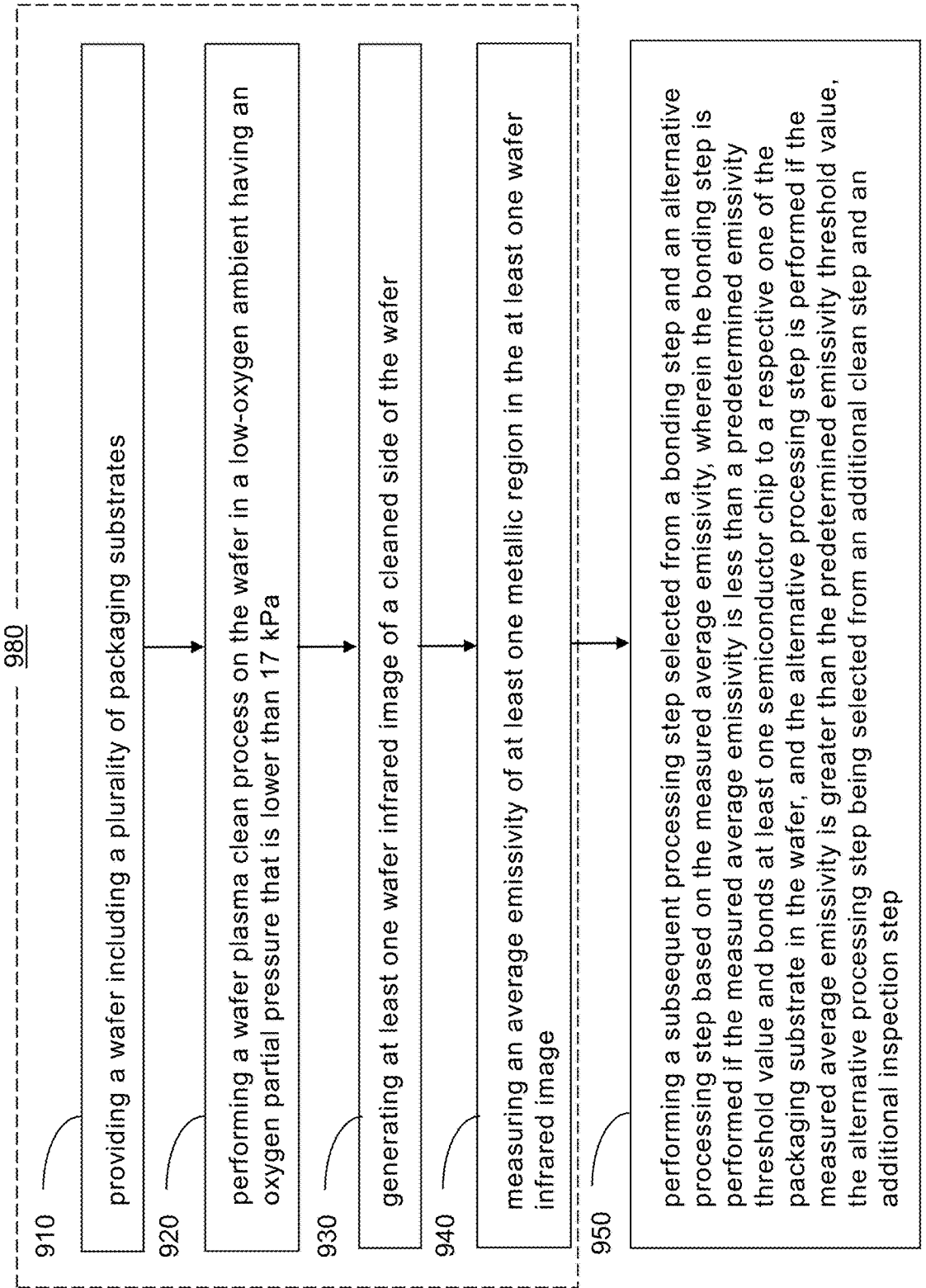

980

910 providing a wafer including a plurality of packaging substrates 920 performing a wafer plasma clean process on the wafer in a low-oxygen ambient having an oxygen partial pressure that is lower than 17 kPa 930 generating at least one wafer infrared image of a cleaned side of the wafer 940 measuring an average emissivity of at least one metallic region in the at least one wafer infrared image 950 performing a subsequent processing step selected from a bonding step and an alternative processing step based on the measured average emissivity, wherein the bonding step is performed if the measured average emissivity is less than a predetermined emissivity threshold value and bonds at least one semiconductor chip to a respective one of the packaging substrate in the wafer, and the alternative processing step is performed if the measured average emissivity is greater than the predetermined emissivity threshold value, the alternative processing step being selected from an additional clean step and an additional inspection step

FIG. 9

POST-PLASMA CLEAN INFRARED IMAGE INSPECTION FOR OXIDELESS BONDING AND APPARATUS FOR EFFECTING THE SAME

BACKGROUND

Oxide free surfaces are desired in order to provide reliable solder bonding between a semiconductor chip and a substrate. The presence of interfacial oxide around a solder material portion can degrade electrical connection. These degradations in the electrical connection may cause early electrical and/or structural failures in a bonded assembly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a first flow chart illustrating a first exemplary sequence of processing steps of the present disclosure.

FIG. 9 is a second flow chart illustrating a second exemplary sequence of processing steps of the present disclosure.

DETAILED DESCRIPTION

Figure 1:
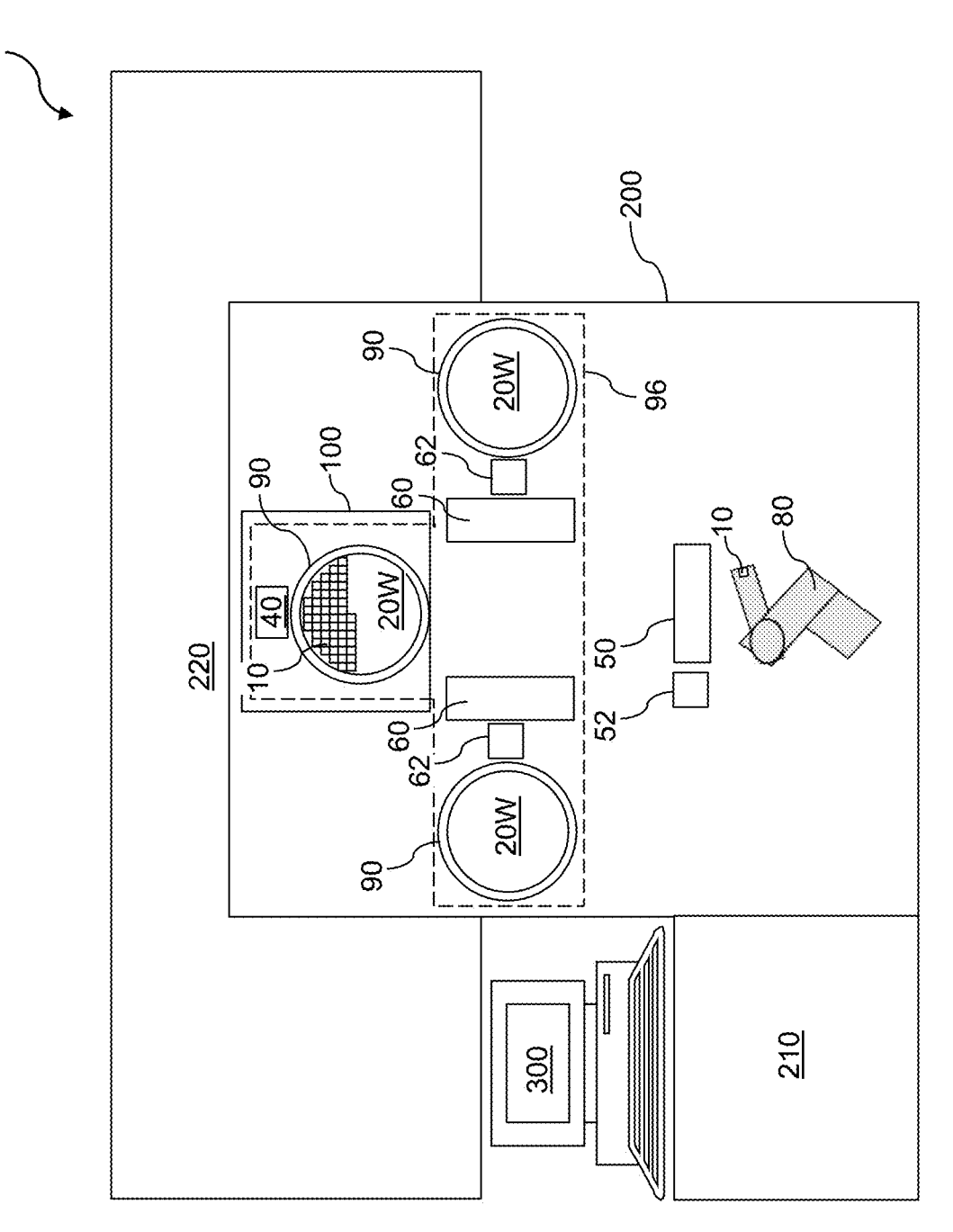
FIG. 1 is a schematic view of a bonding apparatus according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Embodiments of the present disclosure are directed to a method and an apparatus for bonding semiconductor chips to a wafer including at least one packaging substrate. The embodiment methods and apparatus may use at least one plasma clean process and perform an inspection of the cleaned surfaces of the semiconductor chips and/or the wafer for residual oxide content to ensure that the cleaned surfaces are free or substantially free of metal oxides. In various embodiment methods and apparatus, at least one infrared camera may be used to generate at least one infrared image of the cleaned surface(s) of the semiconductor chips and/or the wafer. The at least one infrared camera may be used to detect presence of metal oxide on the bonding structures of a semiconductor chip and/or the wafer. In some embodiments, infrared image(s) of the semiconductor chip may be generated at a specific wavelength in an infrared range, and the infrared images may be analyzed to determine the emissivity of the cleaned metallic surfaces.

Emissivity of metallic regions of the semiconductor chips and/or the wafer are measured, and the bonding process may be performed after ensuring that the measured emissivity values of the metallic regions of the semiconductor chips and/or the wafer are below a respective predetermined threshold value to indicate the absence of metal oxide from the bonding structures. In instances in which the measured values of the emissivity of metallic regions of the semiconductor chips and/or the wafer exceeds the respective predetermined threshold value, a further cleaning process may be performed or an inspection process may be performed and suitable remedial steps can be performed on bonding surfaces prior to performing a bonding process. Electrical conductivity and reliability of bonded structures can be enhanced by measuring and confirming the oxygen content of the bonding surfaces prior to bonding using analysis of infrared images of the bonding surfaces. The methods and apparatus of the present disclosure may be used to implement a fluxless thermocompressive bonding process.

Referring to FIG. 1, a bonding apparatus 1000 according to an embodiment of the present disclosure is illustrated. The bonding apparatus 1000 comprises a process chamber 200 including chamber enclosure and an ambient control system configured to provide a low-oxygen ambient. The bonding apparatus 1000 comprises chip feed-in module 210 configured to feed semiconductor chips 10 into the process chamber 200, and an equipment frontend module (EFEM) 220 configured to automate the handling and processing of wafers 20W that are processed in the bonding apparatus 1000. The bonding apparatus 1000 may further comprise a control system 300, which includes at least one processor in communication with at least one memory and configured automate, and control, various operational steps of the bonding apparatus 1000 during the bonding process.

The process chamber 200 may include a chamber enclosure and an ambient control system configured to provide a low-oxygen ambient within a volume that is spatially bounded by the chamber enclosure. As used herein, a "low-pressure ambient" refers to an ambient having an oxygen partial pressure that is lower than the oxygen partial pressure (of about 21.23 kPa) in a standard atmospheric condition. In one embodiment, the low-oxygen ambient may have an oxygen partial pressure that is lower than about 80% of the oxygen partial pressure in standard atmospheric conditions, such as lower than 17 kPa. The total pressure of the low-oxygen ambient may be in a range from 10 Pa to 120 kPa. The atmospheric pressure in the standard atmospheric condition is 101.33 kPa. In one embodiment, the partial pressure of oxygen in the low-oxygen ambient may be in a range from $1.0 \times 10^{-6}$ Pa to 10.13 kPa. Generally, the low oxygen partial pressure in the low-oxygen ambient may be provided by reducing the total pressure of the low-oxygen ambient and/or by reducing the fraction of oxygen in the composition of the ambient gas in the low-oxygen ambient. In one embodiment, the molecular fraction of oxygen in the low-oxygen ambient may be in a range from $1.0 \times 10^{-9}$ to 0.2095 (which is the fraction of oxygen atoms in the normal atmospheric composition). A suitable mechanism (not expressly shown) such as an ambient gas supply nozzle, an exhaust port, and/or a vacuum pumping port may be provided as needed to maintain the composition and the pressure of the low-oxygen ambient at a pre-determined level. The chamber enclosure may comprise suitable valved openings to provide transfer of semiconductor chips 10 and wafers 20W therethrough.

The chip feed-in module 210 may be used to accurately and reliably feed semiconductor chips 10 during the bonding process. The chip feed-in module 210 may comprise a series of mechanisms, such as a loader, an aligner, and/or and a conveyor, which collectively function to transfer the semiconductor chips 10 into the process chamber 200 during the bonding process. For example, the loader may be used to place the semiconductor chips 10 onto a transfer module, and the aligner may be used to align and position the semiconductor chips 10. The conveyer may be used to move the semiconductor chips 10 into the processing chamber 200. Optionally, the chip feed-in module 210 may also include sensors and mechanical means for detecting and correcting misalignments and/or jams during transport of the semiconductor chips 10.

The equipment frontend module (EFEM) 220 is an optional component, which, if used, may further automate the bonding operation. For example, in a high volume manufacturing system for collective die-to-wafer (Co-D2W) bonding, the equipment frontend module (EFEM) 220 may be used to automate the handling and processing of wafers 20W and semiconductor chips 10. In this embodiment, the EFEM 220 may be used to load and unload wafers 20W and assemblies of wafers 20W and semiconductor chips 10. Further, the EFEM 220 may be used to provide transport of the wafers 20W and the assemblies of wafers 20W and semiconductor chips 10 between the bonding apparatus 1000 and other manufacturing tools (not shown) within a fabrication facility (FAB). Such automation helps to improve the efficiency and consistency of the bonding process while reducing the risk of contamination or damage to the wafers 20W and the semiconductor chips 10.

The bonding apparatus 1000 may comprise a chip transfer system 80 configured to transport at least one semiconductor chip 10 between the chip feed-in module 210 and the process chamber 200, and within various locations within the process chamber 200. The chip transfer system 80 may comprise various robotic components and a movement controller configured to provide transport of at least one semiconductor chip 10 throughout the process chamber 200.

The bonding apparatus 1000 may comprise a chip plasma treatment system 50 comprising a first plasma nozzle configured to generate a first plasma in a first plasma region. The chip transfer system 80 may be configured to transport a semiconductor chip 10 and to position the semiconductor chip 10 within the first plasma region.

The chip plasma treatment system 50 may be configured to perform atmospheric pressure plasma jet (APPJ) treatment on each semiconductor die 10 that is positioned in the first plasma region. The APPJ treatment can clean surface contaminants from bonding structures and solder material portions prior to performing a thermocompression bonding (TCB) process between a semiconductor die 10 and a packaging substrate provided in a wafer 20W. Generally, APPJ treatment can be used in semiconductor fabrication to clean, activate and treat surfaces. APPJ uses a low-temperature plasma, generated at atmospheric pressure, to modify the surface chemistry of a material. Plasma is a state of matter that is created when a gas is ionized, or when its atoms are stripped of some of their electrons, creating mixture of ions, electrons, and neutral particles. Plasma may be created at a variety of pressures, including atmospheric pressure.

The APPJ system typically consists of a plasma generator, a gas feed system, and a nozzle that directs the plasma onto the surface to be treated. The plasma may be generated by introducing a gas, such as argon or oxygen, into the plasma generator, where it is excited by an electrical discharge. The plasma generator may create a plasma, which is then directed through the nozzle and onto the surface to be treated. APPJ may be a non-contact, low-temperature, and low-pressure process, which makes APPJ compatible with a wide range of materials and can be easily integrated into existing semiconductor fabrication processes.

The generated high-energy plasma of an APPJ system may remove contaminants and particles from surfaces, providing a clean surface for subsequent processing steps. The plasma may modify the surface chemistry of a material, increasing the reactivity of the material and making the material more suitable for subsequent processing steps. The plasma may also be used to deposit thin films or change the surface morphology of a material. The plasma may be used to remove or passivate surface oxides and other unwanted surface layers. The plasma may also be used to change the surface energy of a material to improve the adhesion of subsequent layers.

There are several factors that may contribute to the time-consuming nature of APPJ treatment. One factor is the desire for precise control of the plasma parameters, such as temperature, plasma density, and gas flow rate. These parameters should be carefully controlled in order to achieve the desired surface modification without damaging the material being treated. Such control may consume a large amount of time and attention from an operator. In addition, the material surface may further benefit from a careful cleaning and preparation before the APPJ treatment. This may include removing contaminants, roughing up the surface to improve adhesion, or applying a pre-treatment to improve the effectiveness of the plasma treatment. Sequential performance of the APPJ treatment and the bonding process for each bonded pair of a semiconductor die and a packaging substrate may be time-consuming.

The chip plasma treatment system 50 forms a reducing plasma (i.e., a de-oxidizing plasma) around a semiconductor chip 10 that is placed in the first plasma region by generating a plasma jet, which is an atmospheric pressure plasma jet (APPJ). Generally, an atmospheric pressure plasma jet (APPJ) may be generated by passing a gas (such as air, argon, or helium) through a high voltage electrical discharge. The resulting plasma is composed of highly reactive species, such as ions and radicals, which may be used for a variety of industrial and research applications. The APPJ from the chip plasma treatment system 50 can be used for surface cleaning of metallic surfaces on each semiconductor chip 10 that is placed in the first plasma region. A reducing gas is mixed with a respective plasma jet, and the resulting reactive species are directed towards the surfaces to be cleaned, effectively reducing and removing the contaminants on the surfaces.

The bonding apparatus 1000 of the present disclosure may comprise a chip infrared camera 52 configured to generates at least one chip infrared image from the semiconductor chip 10. We reference to FIG. 3, the chip infrared camera 52 may be configured to generate at least one infrared image of an object within its field of view 53. The at least one infrared image may be an infrared spectral image of the object within a wavelength range from 800 nm to 30 microns, such as from 1.2 microns to 30 microns and/or from 2 microns to 30 microns. In one embodiment, the at least one infrared image may be taken within an infrared spectral band in a range from 2 microns to 30 microns. In an illustrative example, the infrared spectral band may have a lower cutoff wavelength in a range from 3 microns to 5 microns, and an upper cutoff wavelength in a range from 10 microns to 30 microns.

Generally, the process controller 300 may be configured to control operation of the chip infrared camera 52, and to analyze image data generated from the chip infrared camera 52. In one embodiment, the process controller 300 may be configured to measure a first average emissivity of at least one metallic region in the at least one chip infrared image generated by the chip infrared camera 52, and to determine a subsequent processing step for the bonding apparatus 1000 to perform. In an illustrated example, the subsequent processing step may be selected from a bonding step and an alternative processing step. The selection of the subsequent processing step may be based on the measured first average emissivity. For example, the bonding step may be performed if the measured first average emissivity is less than a predetermined emissivity threshold value. The bonding step may bond the semiconductor chip 10 to a packaging substrate within a wafer 20W. The alternative processing step may be performed if the measured first average emissivity is greater than the predetermined emissivity threshold value. The alternative processing step may be a processing step that remedies suspected presence of a significant amount of metal oxide on the metallic surfaces within the semiconductor chip 10. For example, the alternative processing step may be selected from an additional clean step (such as an additional plasma treatment step using the chip plasma treatment system 50) and an additional inspection step.

In one embodiment, the bonding apparatus 1000 comprises at least one stage 90 located in the process chamber 200 and configured to hold at least one packaging substrate thereupon. In one embodiment, the at least one packaging substrate may be provided within a respective wafer 20W. In one embodiment, each wafer 20W may comprise a respective plurality of packaging substrates such as a respective two-dimensional array of packaging substrates.

The bonding apparatus 1000 of the present disclosure may comprise at least one wafer plasma treatment system 60 comprising a respective second plasma nozzle configured to generate a plasma in a respective second plasma region. Each wafer plasma treatment system 60 forms a reducing plasma over a wafer 20W that is placed in a respective second plasma region by generating a plasma jet, which is an atmospheric pressure plasma jet (APPJ). The APPJ in each second plasma region can be used for surface cleaning of metallic surfaces of a each wafer 20W that is placed in the respective second plasma region.

The bonding apparatus 1000 of the present disclosure may comprise a wafer transfer system 96 configured to transfer a stage 90 with a wafer 20W thereupon between the EFEM 220 and each second plasma region. Further, the bonding apparatus 1000 of the present disclosure may comprise a bonding chamber 100 that contains a thermocompression bonding (TCB) head 40 therein. The wafer transfer system 96 may be configured to transfer the stage 90 between each second plasma region and the bonding chamber 100.

The bonding apparatus 1000 of the present disclosure may comprise at least one wafer infrared camera 62 configured to generates at least one wafer infrared image from a surface of the wafer 20W. In one embodiment, the process controller 300 may be configured to measure a second average emissivity of at least one metallic region in the at least one wafer infrared image, and may be configured to determine suitability of each wafer 20W for a bonding step to be subsequently performed. The wafer 20W is determined to be suitable for the bonding step if the measured second average emissivity is less than a second predetermined emissivity threshold value. The wafer is determined to be unsuitable for the bonding step if the measured second average emissivity is greater than the second predetermined emissivity threshold value.

In one embodiment, the wafer infrared camera 62 and the stage 90 may be configured to move relative to each other along a direction that is perpendicular to a spacing between the wafer infrared camera 62 and the stage 90. In one embodiment, the process controller may be configured to generate a plurality of wafer infrared images of different areas of the wafer 20W as the at least one wafer infrared image by inducing relative lateral movement between the wafer infrared camera 62 and the stage 90.

The apparatus of the present disclosure illustrated in FIG. 1 may be used to perform a flux-free bonding process using in-situ plasma clean on semiconductor chips 10 and a wafer 20W including at least one packaging substrate therein.

Figure 2:
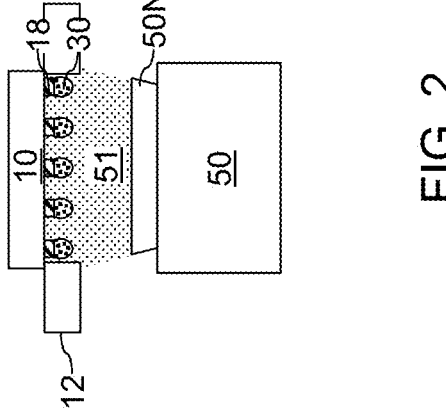
FIG. 2 is a vertical cross-sectional view of a chip plasma treatment system comprising a chip-side plasma nozzle during a chip plasma clean process according to an embodiment of the present disclosure.

Referring to FIG. 2, a chip plasma clean step is illustrated, which may be performed using the chip plasma treatment system 50 of the bonding apparatus 1000 in FIG. 1. The chip plasma treatment system 50 may comprise a chip-side plasma nozzle 50N as a component thereof. Generally, a chip plasma clean process may be performed on a semiconductor chip 10 in a low-oxygen ambient having an oxygen partial pressure that is lower than 17 kPa. The semiconductor chip 10 may be any type of semiconductor chip known in the art. For example, the semiconductor chip 10 may comprise a processor die, a memory die, or a composite die such as a fan-out package including at least one semiconductor die and a fan-out structure such as a fan-out interposer attached to the at least one semiconductor die. The semiconductor chip 10 may comprise an array of chip-side bonding structures 18. For example, the chip-side bonding structures 18 may comprise metallic bonding structures such as copper bonding pads or copper pillar structures. An array of solder material portions 30 may be bonded to the array of chip-side bonding structures 18.

The semiconductor chip 10 may be supported by a chip carrier 12 having an opening therethrough. The semiconductor chip 10 may be positioned over the chip carrier 12 such that the array of solder material portions 30 is located within the opening in the chip carrier 12. The chip carrier and/or the chip plasma treatment system 50 may be positioned relative to each other such that first plasma jet 51 generated by the chip plasma treatment system 50 is directed to the entirety of the array of solder material portions 30. The reducing plasma of the first plasma jet 51 removes the oxide materials on the surfaces of the array of solder material portions 30.

Generally, the chip plasma treatment system 50 forms a reducing plasma (i.e., a de-oxidizing plasma) around the solder material portions 30 by generating a plasma jet, which is an atmospheric pressure plasma jet (APPJ). Generally, an atmospheric pressure plasma jet (APPJ) may be generated by passing a gas (such as air, argon, or helium) through a high voltage electrical discharge. The resulting plasma is composed of highly reactive species, such as ions and radicals, which may be used for a variety of industrial and research applications. Specifically, ions in the first plasma jet 51 are directed towards the solder material portions 30 to clean the surfaces of the solder material portions 30. The high energy species in the plasma interact with the surfaces, thereby breaking down, and removing, contaminants on the solder material portions 30. In one embodiment, the first plasma jet 51 uses ions of a reducing gas to reduce and/or remove contaminants (such as oxygen or water vapor) on the surfaces of the solder material portions 30. A reducing gas is mixed with a respective plasma jet, and the resulting reactive species are directed towards the surfaces to be cleaned, effectively reducing and removing the contaminants on the surfaces.

Exemplary reducing gases that may be used to for the plasma jet from the chip plasma treatment system 50 may include, but are not limited, to hydrogen, various hydride gases (such as methane, ammonia, acetylene, etc.), carbon monoxide, and various volatile compounds including hydrogen radicals. Hydrogen gas is a strong reducing agent and may be used to remove oxides, sulfates, and other contaminants from surfaces. Methane is a hydrocarbon gas that may be used to remove carbon-based contaminants from surfaces. Ammonia is a weak reducing agent that may be used to remove nitrides and other nitrogen-based contaminants from surfaces. Carbon dioxide may be used to remove organic contaminants from surfaces. Nitrogen may be used to remove oxygen-based contaminants. Propane is a hydrocarbon gas that may be used to remove carbon-based contaminants from surfaces. In some other embodiments, non-reducing gases such as argon and helium may be optionally used to cool down the plasma, and/or to protect the plasma jet and to improve the plasma properties. Generally, any ion that acts as a reducing agent may be used. Each atmospheric pressure plasma jets generated by the at least one chip plasma treatment system 50 does not need to be at an "atmospheric" pressure, but may be any pressure that may be used to generate the condition of an atmospheric pressure plasma jet known in the art.

The temperature of the low-oxygen ambient in the process chamber 200 is lower than the reflow temperature of the solder material portions 30. The temperature of the low-oxygen ambient may be in range from 10 degrees Celsius to 200 degrees Celsius, and may be in a range from 10 degrees Celsius to 100 degrees Celsius, such as from 10 degrees Celsius to 60 degrees Celsius.

Figure 3:
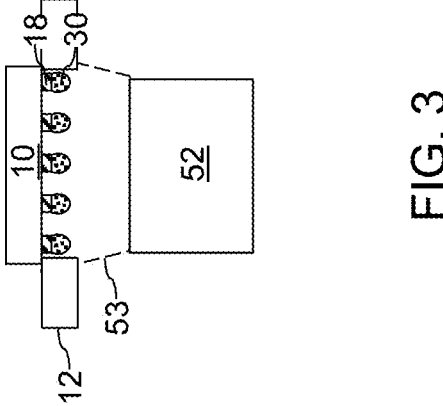
FIG. 3 is a vertical cross-sectional view of a chip infrared camera during generation of at least one chip infrared image according to an embodiment of the present disclosure.

Referring to FIG. 3, the chip carrier 12 and the semiconductor chip 10 may be positioned over a chip infrared camera 52. In this embodiment, the chip carrier 12 and the semiconductor chip 10 may be transported over the chip infrared camera 52 such that the bottom surface of the semiconductor chip 10 is positioned at least partly, or fully, within the field of view 53 of the chip infrared camera 52. The field of view 53 of the chip infrared camera 52 may be larger than, or smaller than, the size of the opening in the chip carrier 12. In an illustrative example, the field of view 53 of the chip infrared camera 52 may be in a range from 0.1 mm×0.1 mm to 40 mm×40 mm, although lesser and greater sizes may also be used for the field of view 53. The vertical spacing between the chip infrared camera 52 and the array of solder material portions may be in a range from 0.1 mm to 30 cm, although lesser and greater vertical spacings may also be used. The angle of view of the lens of the chip infrared camera may be in a range from 1 degree to 179 degrees, such as from 5 degrees to 60 degrees. In some embodiment, the chip infrared camera 52 may be replaced with an array of at least two chip infrared cameras 52, each configured to generate at least one infrared image of the bottom surface of the semiconductor chip 10 and the array of solder material portions 30 thereupon. Each chip infrared camera 52 may be configured to receive an optical input only within a predetermined wavelength range, such as a wavelength range that does not exceed the range from 2 microns to 30 microns. For example, an optical filter may be provided within each chip infrared camera 52 to ensure that each optical input has a wavelength greater than 2 microns.

The chip infrared camera(s) 52 may generate at least one chip infrared image of a cleaned side of the semiconductor chip 10. In one embodiment, the at least one chip infrared image of a cleaned side of the semiconductor chip 10 includes at least one metallic region, such as at least one region that captures the solder material portions 30. Generally, presence of metal oxide on the surface of the solder material portions 30 results in high emissivity in the wavelength range from 2 microns and 30 microns, while absence of metal oxide on the surface of the solder material portions 30 results in low emissivity in the wavelength range from 2 microns and 30 microns.

Figure 4:
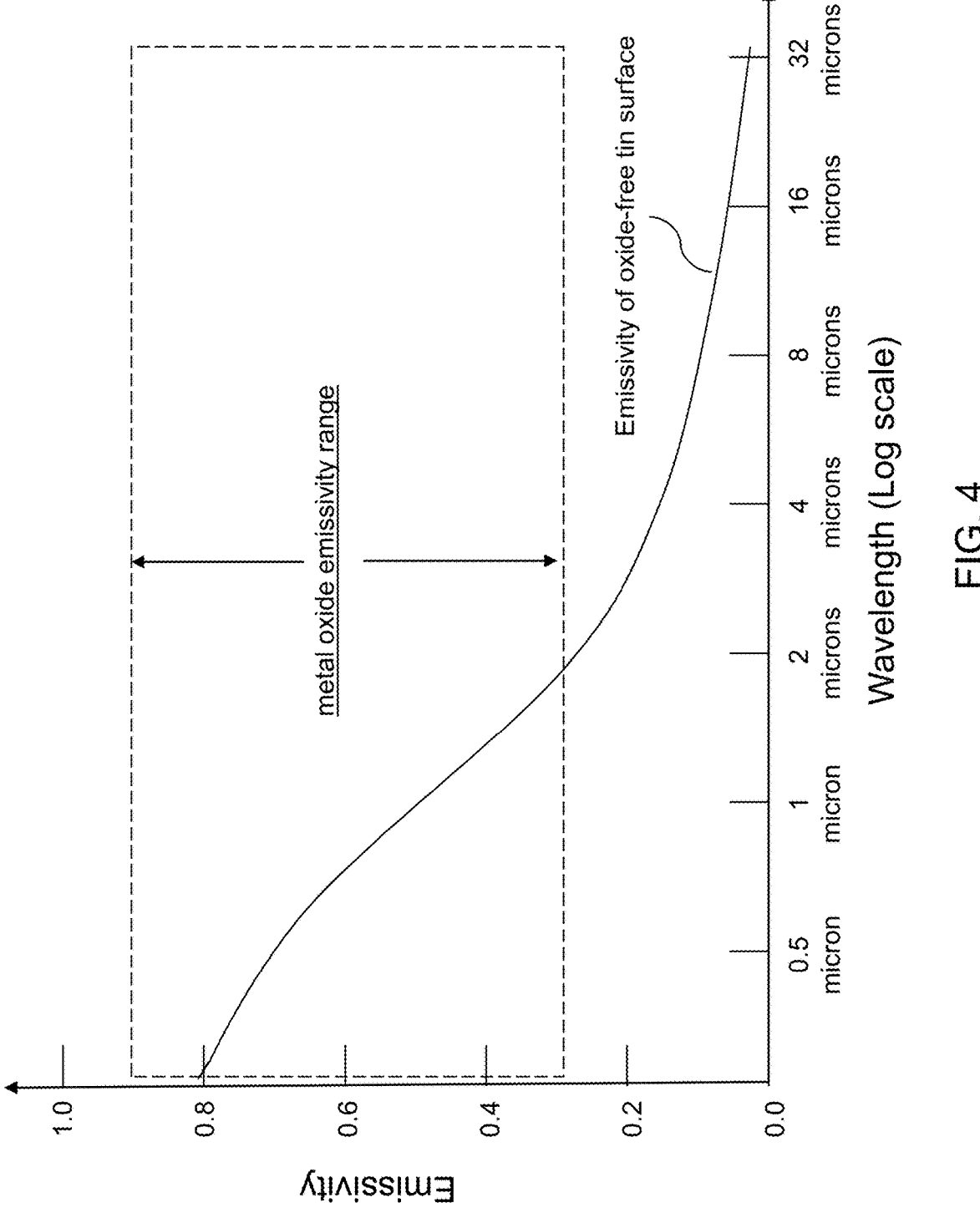
FIG. 4 is a graph illustrating emissivity of an oxide-free tin surface and a typical metal oxide surface.

Referring to FIG. 4, emissivity of oxide-free tin surface is illustrated as a function of wavelength. Generally, within the wavelength range from 2 microns to 30 microns, the emissivity of oxide-free tin surface is less than 0.30. With the wavelength range from 4 microns to 30 microns, the emissivity of oxide-free tin surface is less than 0.15. Such low emissivity values are common characteristic of metallic surfaces and especially for polished metallic surfaces. For example, polished copper has emissivity less than 0.15 (and typically in a range from 0.04 to 0.10) within the wavelength range from 2 microns to 30 microns. Thus, bonding structures having polished or electroplated copper surfaces have an emissivity less than 0.15, and typically less than 0.10 in the wavelength range from 2 microns to 30 microns.

In contrast, metal oxide surfaces have emissivity that is higher than the emissivity of oxide-free metal surfaces. Typically, metal oxide surfaces (such as tin oxide surfaces that may be present on solder material portions 30 in embodiments in which a plasma clean does not thoroughly remove the tin oxide material) have emissivity in a range from 0.3 to 0.8 within the wavelength range from 0.25 microns to 30 microns. Therefore, metal oxide surfaces and oxide-free metal surfaces can be distinguished in infrared images of metallic surfaces, such as the at least one chip infrared image generated by the chip infrared camera(s) 52 of the present disclosure.

Referring collectively to FIGS. 1, 3, and 4, an average emissivity of at least one metallic region in the at least one chip infrared image can be measured using an automated image analysis program, which can be run by the process controller 300. The process controller 300 may determine a subsequent processing step selected from a bonding step and an alternative processing step based on the measured average emissivity. For example, the bonding step may be performed in response to determining that the measured average emissivity is less than a predetermined emissivity threshold value to bond the semiconductor chip 10 to a packaging substrate 20. An alternative processing step may be performed in response to determining that the measured average emissivity is greater than the predetermined emissivity threshold value. The alternative processing step may be selected from an additional clean step and an additional inspection step.

In one embodiment, each semiconductor chip 10 may comprise an array of chip-side bonding structures 18, and an array of solder material portions 30 may be attached to the array of chip-side bonding structures 18. In one embodiment, a metallic region (i.e., a region representing a metallic structure) in the at least one chip infrared image may comprise an image of one of the solder material portions 30. In one embodiment, the chip plasma clean process directs a plasma jet generated by at least one chip plasma treatment system 50 having a respective plasma nozzle 51 that is directed to the cleaned side of the semiconductor chip 10.

In one embodiment, the at least one chip infrared image of the cleaned side of the semiconductor chip 10 may be generated using a chip infrared camera 52 located within the low oxygen ambient. In one embodiment, the chip infrared camera 52 has a field of view 53 that includes an entire area of the cleaned side of the semiconductor chip 10. In one embodiment, the average emissivity may be measured using an image analysis program that identifies a plurality of metallic regions within the at least one chip infrared image, calculates emissivity values for each of the plurality of metallic regions, and calculate an average of the emissivity values for the plurality of metallic regions within the at least one chip infrared image. In one embodiment, the chip infrared camera 52 generates the at least one chip infrared image by using optical input having a wavelength range between 2 microns to 30 microns, and not including any wavelength less than 2 microns.

In one embodiment, the predetermined emissivity threshold value may be in a range from 0.05 to 0.30. The predetermined emissivity threshold value generally depends on the wavelength range used to generate the at least one chip infrared image. If the wavelength range used to generate the at least one chip infrared image has a lower wavelength limit greater than 5 microns, the predetermined threshold value may be less than 0.15, and/or less than 0.125, and/or less than 0.10. Generally, any metallic region exhibiting emissivity greater than 0.3 may be identified as a region of a metal oxide, such as tin oxide that is formed on a surface of a solder material portion 30. Thus, an infrared image can be used to identify presence of metal oxide on metallic surfaces such the surfaces of the solder material portions 30 and/on the surfaces of the chip-side bonding structures 18 comprising copper.

Further, the infrared image may be used to display chromatic aberration for detection of metal oxides. In one embodiment, multiple infrared images of a same area may be generated by the at least chip infrared camera 52, and presence of surface oxides on the solder material portions 30 or the chip-side bonding structures 18 can be detected by comparing the emissivity differences between the metallic regions within multiple infrared images taken at different infrared wavelength ranges. The process controller 300 may be loaded with an image comparison program that compares emissivity values of metallic regions in multiple infrared wavelength ranges taken at different infrared wavelength ranges for a same metallic structure (such as a solder material portion 30 or a chi-side bonding structure 18).

Figure 5:
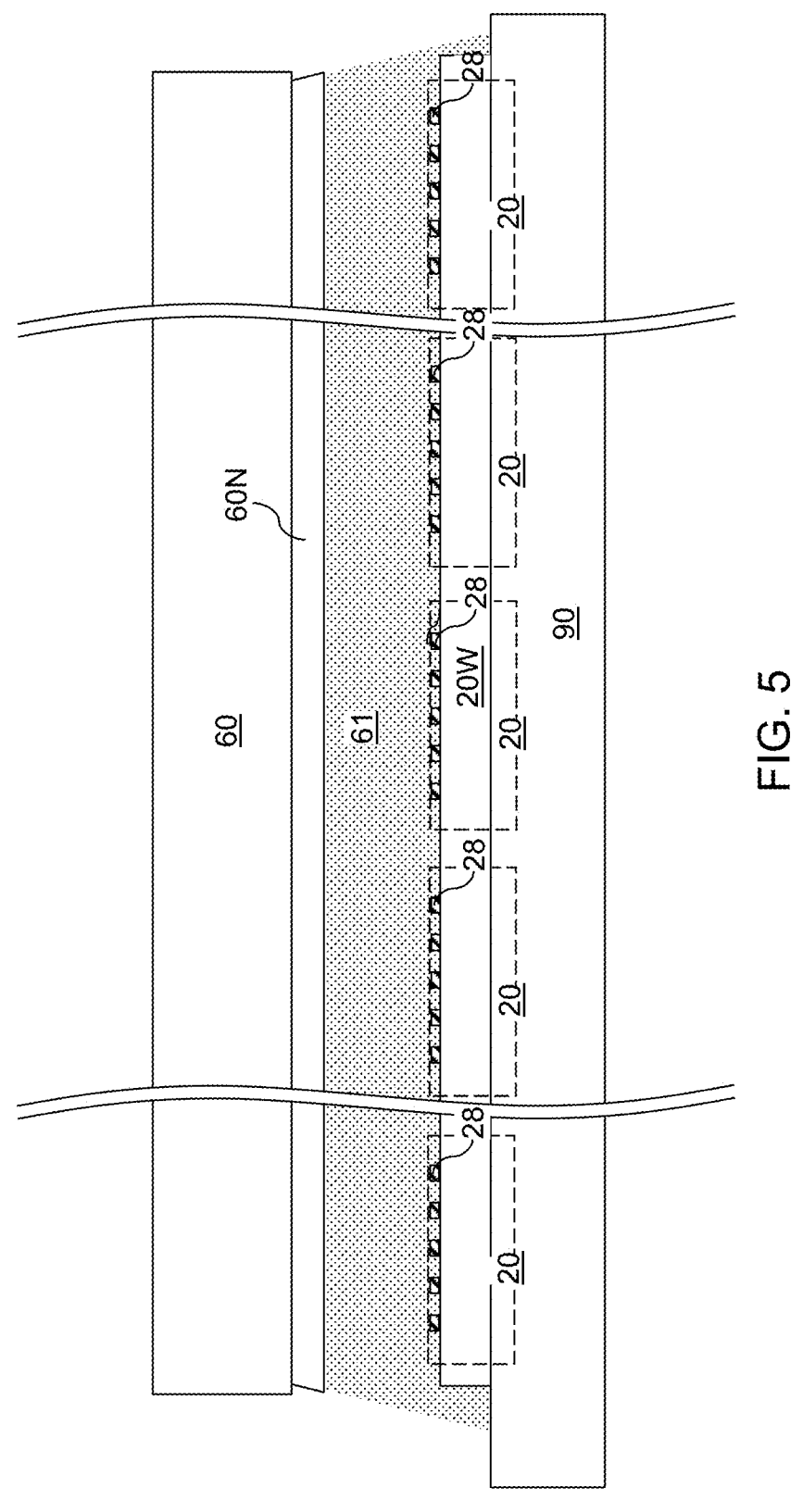
FIG. 5 is a vertical cross-sectional view of a wafer plasma treatment system comprising a substrate-side plasma nozzle during a wafer plasma clean process according to an embodiment of the present disclosure.

Referring to FIG. 5, the at least one wafer plasma treatment system 60 may be used to perform a wafer plasma clean process for each wafer 20W to be processed in the bonding apparatus 1000. The wafer plasma treatment system 60 comprises a substrate-side plasma nozzle 60N directed to a wafer 20W upon positioning of the wafer 20W in a respective second plasma zone.

In one embodiment, each wafer 20W may include a plurality of packaging substrates 20 therein. Each packaging substrate 20 may comprise an interposer, which may be any type of interposer known in the art. In one embodiment, the interposer may comprise, for example, organic interposer including a respective set of redistribution interconnect structures embedded within a respective set of redistribution dielectric layers. The redistribution interconnect structures may comprise copper, and the redistribution dielectric layers may comprise a respective dielectric polymer material such as polyimide (PI), benzocyclobutene (BCB), or polybenzobisoxazole (PBO). In one embodiment, each packaging substrate 20 may comprise a respective array of package-side bonding structures 28, which may comprise copper pads or copper pillars. The lateral dimensions of each package-side bonding structure 28 may be in a range from 10 microns to 100 microns, although lesser and greater dimensions may also be used. Each wafer 20W to be treated with a wafer plasma clean process may be loaded on a stage 90, which can be transported between the EFEM 220 and various located inside the process chamber 200 (including locations inside the bonding chamber 100) by the wafer transfer system 96.

The wafer plasma clean process may be performed on the wafer 20W that is loaded on the stage 90. The wafer plasma clean process may be performed in the low-oxygen ambient (having an oxygen partial pressure that is lower than 17 kPa) within the process chamber 200. Generally speaking, the low-oxygen ambient in which the wafer plasma clean process is performed may be the same as, or may be different from, the low-oxygen ambient in which the chip plasma clean process described above is performed. While the present disclosure is described using an embodiment in which the same low-oxygen ambient is used for the wafer plasma clean process and for the chip plasma clean process, embodiments are expressly contemplated herein in which two different low-oxygen ambients are used for the wafer plasma clean process and for the chip plasma clean process.

A wafer plasma treatment system 60 may overlie a respective wafer 20W during a wafer plasma clean process.

A second plasma jet 61 generated by the wafer plasma treatment system 60 is directed to at least a portion of the wafer 20W. During the wafer plasma clean process, the second plasma jet 61 is generated by at least one wafer plasma treatment system 60 having a respective plasma nozzle (which is herein referred to as a wafer-side plasma nozzle 60N), and is directed to the side of the wafer 20W to be cleaned. The wafer-side plasma nozzle 60N of the wafer plasma treatment system 60 can be directed downward toward the cleaned surface of the wafer 20W that includes arrays of package-side bonding structures 28. The reducing plasma of the second plasma jet 61 removes the oxide materials on the surfaces of the arrays of package-side bonding structures 28.

Generally, the wafer plasma treatment system 60 forms a reducing plasma (i.e., a de-oxidizing plasma) around the arrays of package-side bonding structures 28 by generating a plasma jet, which is an atmospheric pressure plasma jet (APPJ). The same operational principle may be used to generate each second plasma jet as the first plasma jet from the chip plasma treatment system 50. Thus, ions in the second plasma jet 61 may be directed towards the package-side bonding structures 28 to clean the surfaces of the package-side bonding structures 28. The high energy species in the plasma interact with the surfaces, thereby breaking down, and removing, contaminants on the package-side bonding structures 28. In one embodiment, the second plasma jet 61 uses ions of a reducing gas to reduce and/or remove contaminants (such as oxygen or water vapor) on the surfaces of the package-side bonding structures 28. A reducing gas is mixed with a respective plasma jet, and the resulting reactive species are directed towards the surfaces to be cleaned, effectively reducing and removing the contaminants on the surfaces.

The area of the second plasma jet 61 may be the same as, or may be less than, the area of the underlying wafer 20W. In embodiments in which the area of the second plasma jet 61 is less than the area of the underlying wafer 20W, a scanning process may be used to clean the entire area of the top surface of the wafer 20W. In this embodiment, the wafer plasma treatment system 60 and/or the stage 90 can be removed laterally to provide relative movement between the wafer plasma treatment system 60 and the wafer 20W, and to provide plasma clean of the entire top area of the wafer 20W.

Figure 6:
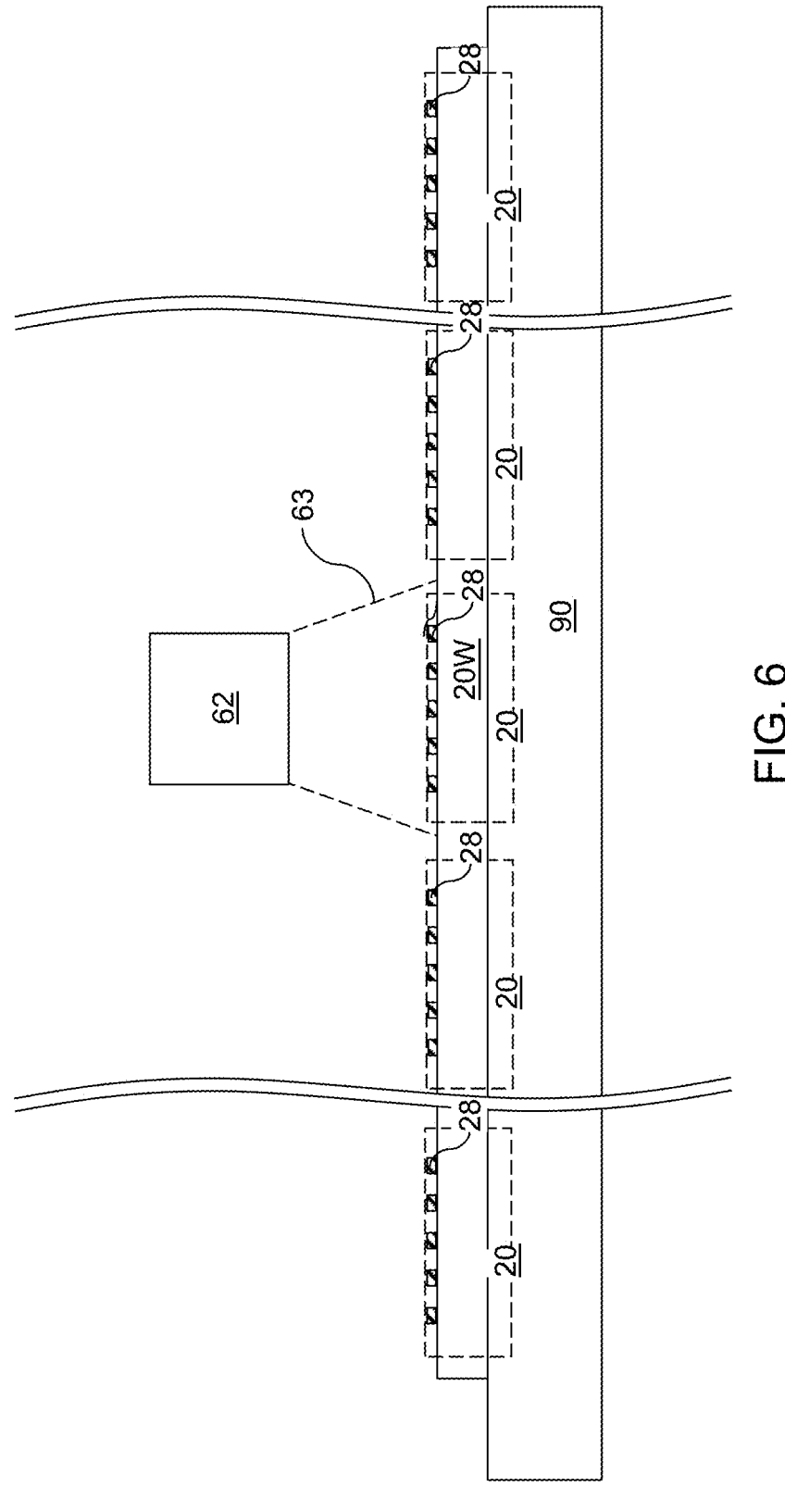
FIG. 6 is a vertical cross-sectional view of a substrate-side infrared camera during generation of at least one wafer infrared image according to an embodiment of the present disclosure.

Referring to FIG. 6, at least one wafer infrared camera 62 can be used to generate at least one wafer infrared image of a cleaned side of the wafer 20W. For example, the stage 90 with a wafer 20W thereupon can be transported to a position that underlies the wafer infrared camera 62 after performing the wafer plasma clean process. The wafer infrared camera 62 is configured to generate at least one infrared image of an object within its field of view 63. In other words, at least one wafer infrared image of the cleaned side of the wafer 20W may be generated using a wafer infrared camera 62 located within the low oxygen ambient.

The at least one infrared image may be an infrared spectral image of the object within a wavelength range from 800 nm to 30 microns, such as from 1.2 microns to 30 microns and/or from 2 microns to 30 microns. In one embodiment, the at least one infrared image may be taken within an infrared spectral band in a range from 2 microns to 30 microns. In an illustrative example, the infrared spectral band may have a lower cutoff wavelength in a range from 3 microns to 5 microns, and an upper cutoff wavelength in a range from 10 microns to 30 microns. In one embodiment, the wafer infrared camera 62 and the wafer

20W move relative to each other, and the wafer infrared camera 62 generates a plurality of wafer infrared images as the at least one wafer infrared image.

Generally, the process controller 300 may be configured to control operation of the wafer infrared camera 62, and to analyze image data generated from the wafer infrared camera 62. In one embodiment, the process controller 300 may be configured to measure a second average emissivity of at least one metallic region in the at least one wafer infrared image generated by the wafer infrared camera 62, and to determine a subsequent processing step for the bonding apparatus 1000 to perform. In an illustrated example, the subsequent processing step may be selected from a bonding step and an alternative processing step.

The selection of the subsequent processing step may be based on the measured second average emissivity. For example, the bonding step may be performed if the measured second average emissivity is less than a predetermined emissivity threshold value, which may be the same as, or may be different from, the predetermined emissivity threshold value for analyzing a chip infrared image discussed above. The bonding step may bond a semiconductor die 10 to a packaging substrate 20 within the wafer 20W. The alternative processing step may be performed if the measured second average emissivity is greater than the predetermined emissivity threshold value. The alternative processing step may be a processing step that remedies suspected presence of a significant amount of metal oxide on the metallic surfaces of the wafer 20W. For example, the alternative processing step may be selected from an additional clean step (such as an additional plasma treatment step using the wafer plasma treatment system 60) and an additional inspection step.

In one embodiment, each packaging substrate 20 within the plurality of packaging substrates 20 comprises a respective array of substrate-side bonding structures 28; and the metallic region in the at least one wafer infrared image comprises an image of one of the substrate-side bonding structures 28 of a respective packaging substrate 20.

In one embodiment, the inspection method described with reference to FIG. 6 may be used in conjunction with the processing steps described with reference to FIGS. 2 and 3. For example, the inspection method described with reference to FIG. 6 may be used in conjunction with a first step of performing a chip plasma clean process on a semiconductor chip 10 in the low-oxygen ambient or another low-oxygen ambient as described with reference to FIG. 2, in conjunction with a second step of generating at least one chip infrared image of a cleaned side of the semiconductor chip 10 as described with reference to FIG. 3, and in conjunction with a third step of using the semiconductor chip 10 as one of the at least one semiconductor chip 10 if a measured average emissivity of at least one metallic region in the at least one chip infrared image is below an additional predetermined emissivity threshold value as described with reference to FIGS. 3 and 4. Alternatively, the first step and the second step may be performed with another semiconductor chip 10 if the measured average emissivity of at least one metallic region in the at least one chip infrared image is below the additional predetermined emissivity threshold value.

As discussed above, polished copper has emissivity less than 0.15 (and typically in a range from 0.04 to 0.10) within the wavelength range from 2 microns to 30 microns. Thus, bonding structures having polished or electroplated copper surfaces have an emissivity less than 0.15, and typically less than 0.10 in the wavelength range from 2 microns to 30 microns. In this embodiment, the additional predetermined threshold value that is used to determine suitability of the metallic surfaces on the wafer 20W (such as the surfaces of the package-side bonding structures 28) after the wafer plasma clean process may be in a range from 0.10 to 0.15.

In one embodiment, the wafer 20W comprises a plurality of packaging substrates 20. In one embodiment, the plurality of packaging substrates comprises an array of organic interposers. In one embodiment, each organic interposer within the array of organic interposers comprises a respective array of substrate-side bonding structures 28. In one embodiment, the wafer plasma clean process cleans each array of substrate-side bonding structures 28 within the wafer 20W.

Figure 7:
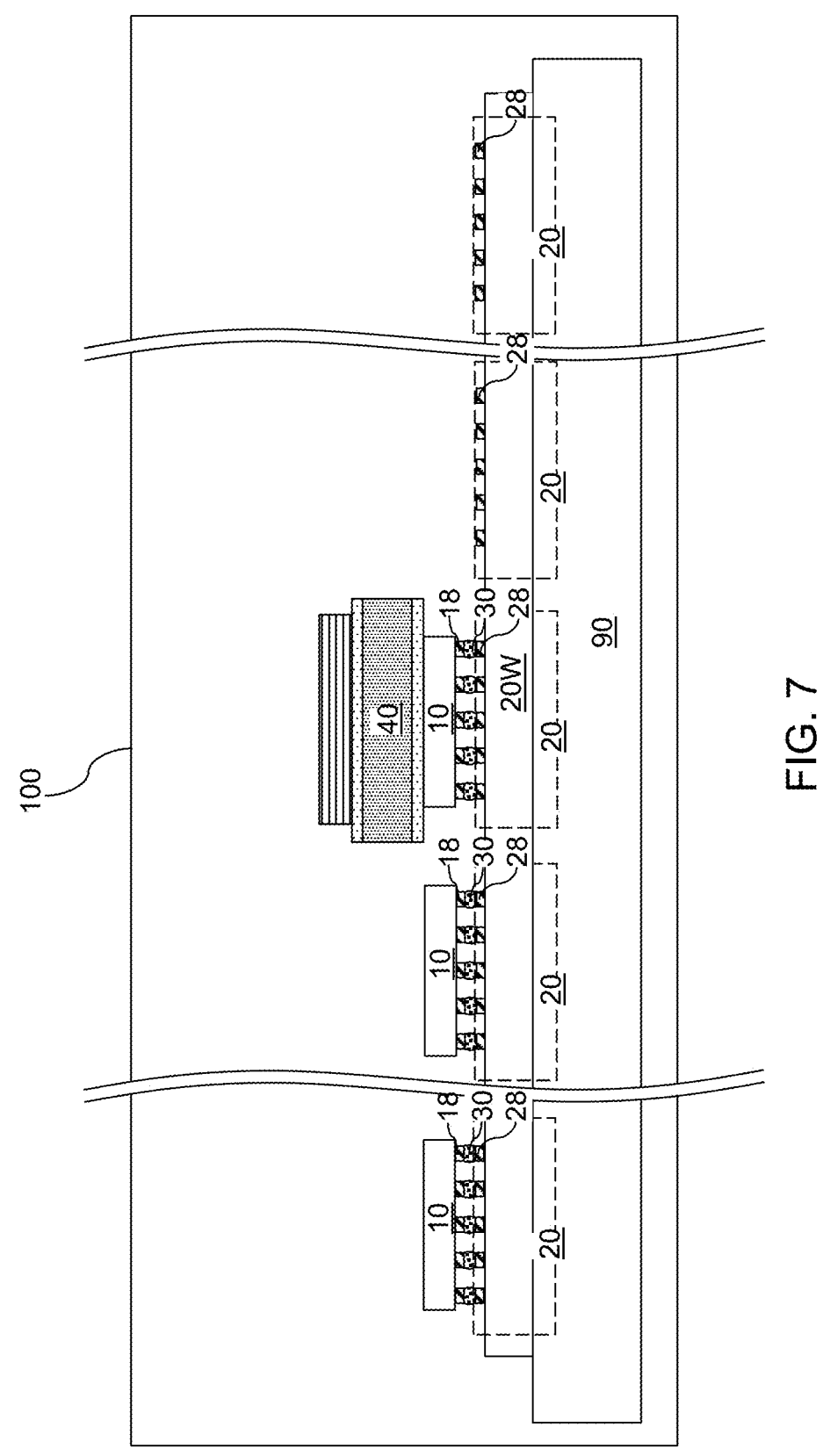
FIG. 7 is a vertical cross-sectional view of a bonding chamber during a thermocompressive bonding process according to an embodiment of the present disclosure.

Referring to FIG. 7, a bonding chamber 100 in the process chamber 200 of the bonding apparatus 1000 of the present disclosure is illustrated during a thermocompressive bonding process according to an embodiment of the present disclosure.

The processing steps described with reference to FIGS. 5 and 6 can be performed to clean and inspect the package-side bonding structures 28 for presence of metal oxide thereupon. The packaging substrates 20 may be inspected individually to ensure that each package-side bonding structure 28 is free of surface metal oxides, or alternatively, to mark packaging substrates 20 that are not suitable for forming a bonded assembly with a semiconductor die 10 due to defects such as irreparable excess oxide presence on the surface of its package-side bonding structure 28.

In addition, the processing steps described with reference to FIGS. 2-4 may be performed to clean and inspect semiconductor chips 10 for the presence of metal oxide thereupon. The semiconductor chips 10 may be inspected individually to ensure that the solder material portion 30 (and optionally the chip-side bonding structures 18) on each semiconductor chip 10 is free of surface metal oxides, or alternately, to discard semiconductor chips 10 that are not suitable for forming a bonded assembly with a packaging substrate 20 due to defects such as irreparable excess oxide presence on the surface of the solder material portions 30.

Thus, a bonding process may proceed after confirming that a package-side bonding structure 28 on the wafer 20W are sufficiently free of metal oxide, and after confirming that the solder material portions 30 on a semiconductor chip 10 to be bonded are sufficiently free of metal oxide. In response to determining that excess metal oxide is detected on the package-side bonding structure 28, an additional wafer plasma clean process may be locally performed, for example, by using a wafer plasma treatment apparatus 60. In response to determining that excess metal oxide is detected on the semiconductor chip 10, an additional chip plasma clean process may be performed, for example, by using a chip plasma treatment apparatus 50.

A thermocompressive bonding head 40 can be used to bond a semiconductor die 10 that is deemed to be sufficiently oxide-free to a packaging substrate 20 that is deemed to be sufficiently oxide-free. The thermocompressive bonding head 40 can hold the semiconductor chip 10 over the packaging substrate 20, can bring the solder material portions 30 of the semiconductor chip 10 to contact with the package-side bonding structures 28, and can induce reflow of the solder material portions 30 to bond the semiconductor die 10 to the packaging substrate 20. Generally, the thermocompressive bonding head 40 may include all necessary components that are configured to provide thermocompressive bonding between a semiconductor chip 10 and a packaging substrate 20. Generally, a commercially available thermocompressive bonding head may be used.

FIG. 8 is a first flow chart illustrating a first exemplary sequence of processing steps of the present disclosure that can be used to form a bonded assembly.

Referring to step 810 and FIGS. 1 and 2, a chip plasma clean process can be performed on a semiconductor chip 10 a low-oxygen ambient having an oxygen partial pressure that is lower than 17 kPa.

Referring to step 820 and FIGS. 1 and 3, at least one chip infrared image of a cleaned side of the semiconductor chip 10 can be generated.

Referring to step 830 and FIGS. 1 and 3, an average emissivity of at least one metallic region in the at least one chip infrared image can be measured, for example, using an automated program (such as an image analysis program) in the process controller 300. In some embodiments, multiple chip infrared images taken at different infrared wavelengths may be used to determine the emissivity distribution of the at least one metallic region over the various infrared wavelengths used to generate the multiple chip infrared images. Use of the emissivity distribution over a wavelength range can facilitate determination on presence or absence of a metal oxide surface.

Referring to step 840 and FIGS. 1, 4, and 7, a subsequent processing step selected from a bonding step and an alternative processing step may be performed based on the measured average emissivity. The bonding step is performed in response to determining that the measured average emissivity is less than a predetermined emissivity threshold value and bonds the semiconductor chip 10 to a packaging substrate 20, and the alternative processing step is performed if the measured average emissivity is greater than the predetermined emissivity threshold value. The alternative processing step may be selected from an additional clean step and an additional inspection step.

FIG. 9 is a second flow chart illustrating a second exemplary sequence of processing steps of the present disclosure that may be used to form a bonded assembly.

Referring to step 910 and FIGS. 1 and 5, a wafer 20W including a plurality of packaging substrates 20 may be provided.

Referring to step 920 and FIGS. 1 and 5, a wafer plasma clean process may be performed on the wafer in a low-oxygen ambient having an oxygen partial pressure that is lower than 17 kPa.

Referring to step 930 and FIGS. 1 and 6, at least one wafer infrared image of a cleaned side of the wafer 20W may be generated.

Referring to step 940 and FIGS. 1 and 6, an average emissivity of at least one metallic region in the at least one wafer infrared image may be measured, for example, using an automated program (such as an image analysis program) in the process controller 300. In some embodiments, multiple wafer infrared images taken at different infrared wavelengths may be used to determine the emissivity distribution of the at least one metallic region over the various infrared wavelengths used to generate the multiple wafer infrared images. Use of the emissivity distribution over a wavelength range can facilitate determination on presence or absence of a metal oxide surface.

Referring to step 950 and FIGS. 1, 6, and 7, a subsequent processing step selected from a bonding step and an alternative processing step may be performed based on the measured average emissivity. The bonding step is performed in response to determining that the measured average emissivity is less than a predetermined emissivity threshold value and bonds at least one semiconductor chip 10 to a respective one of the packaging substrate 20 in the wafer, and the alternative processing step is performed in response to determining that the measured average emissivity is greater than the predetermined emissivity threshold value. The alternative processing step may be selected from an additional clean step and an additional inspection step.

Figure 10:
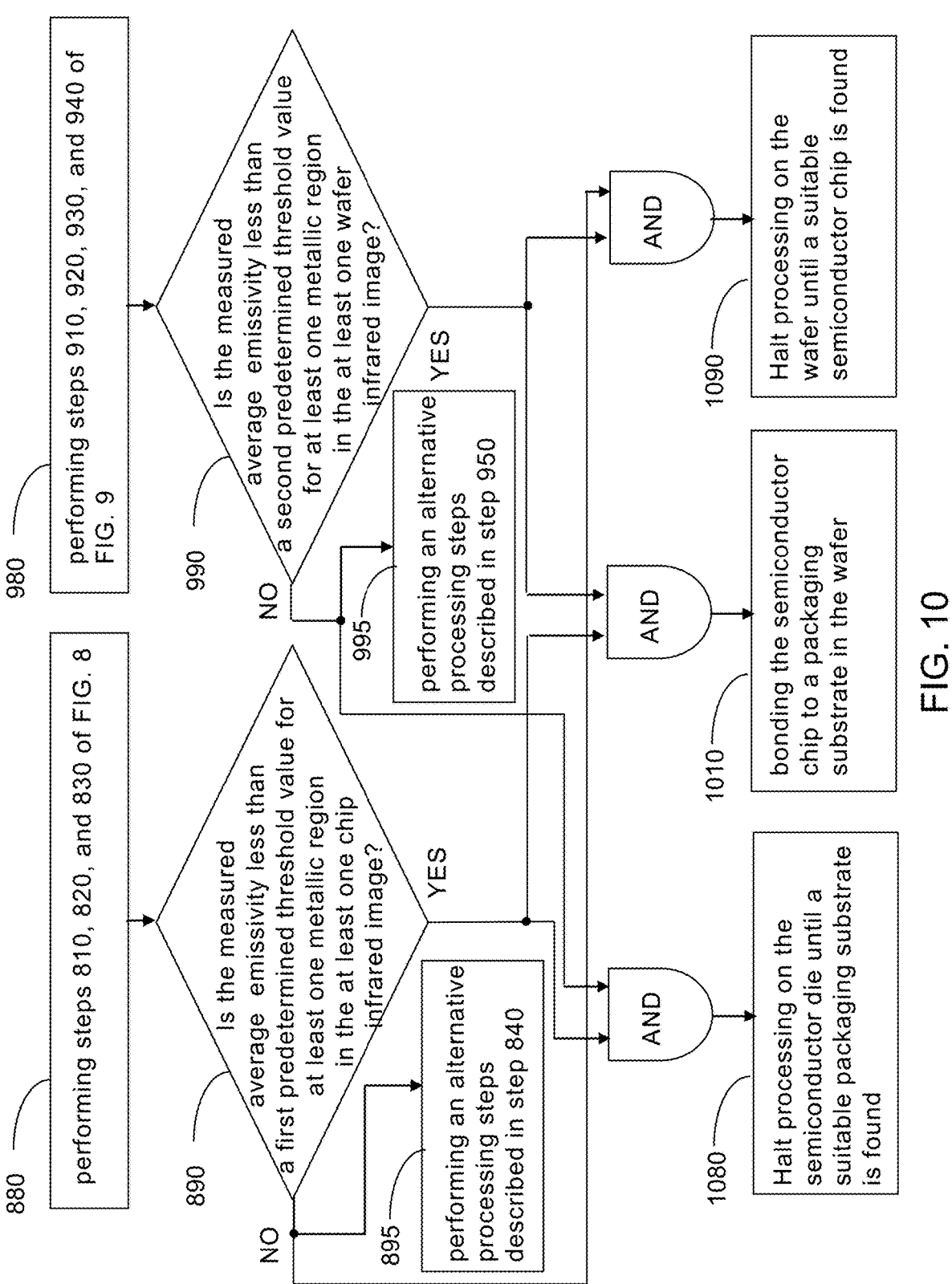
FIG. 10 is a third flow chart illustrating a second exemplary sequence of processing steps of the present disclosure.

FIG. 10 is a third flow chart illustrating a second exemplary sequence of processing steps of the present disclosure that can be used to form a bonded assembly.

Referring to step 880, the processing steps 810, 820, and 830 of FIG. 8 may be performed.

Referring to step 890, a determination may be made, for example, using an image analysis program that runs on the process controller 300, as to whether the measured average emissivity from step 830 is less than a first predetermined threshold value for at least one metallic region in the at least one chip infrared image. In instances in which the determination at step 890 is a "no", the process flow proceeds to step 895, in which an alternative processing step described in step 840 of FIG. 8 may be performed.

Referring to step 980, the processing steps 910, 920, 930, and 940 of FIG. 9 may be performed.

Referring to step 990, a determination may be made, for example, using an image analysis program that runs on the process controller 300, as to whether the measured average emissivity from step 940 is less than a second predetermined threshold value for at least one metallic region in the at least one wafer infrared image. In instances in which the determination at step 990 is a "no", the process flow proceeds to step 995, in which an alternative processing step described in step 950 of FIG. 9 may be performed.

In embodiments in which the determination at step 890 is a "yes" and the determination at step 990 is a "yes", the process flow proceeds to step 1010, in which the semiconductor chip 10 is bonded to a packaging substrate 20 in the wafer 20W, for example, by performing the processing steps described with reference to FIG. 7.

In embodiments in which the determination at step 890 is a "no" and the determination at step 990 is a "yes", the process flow proceeds to step 1090, in which processing on the wafer 20W is halted until a suitable semiconductor chip 10 for bonding (i.e., a semiconductor chip 10 with an array of solder material portions 30 that are substantially free of metal oxide) is found.

In embodiments in which the determination at step 990 is a "no" and the determination at step 890 is a "yes", the process flow proceeds to step 1080, in which processing on the semiconductor die 10 is halted until a suitable packaging substrate 20 for bonding (i.e., a packaging substrate 20 with package-side bonding structures 28 that are substantially free of metal oxide) is found either on the wafer 20W or on another wafer 20W.

Figure 11:
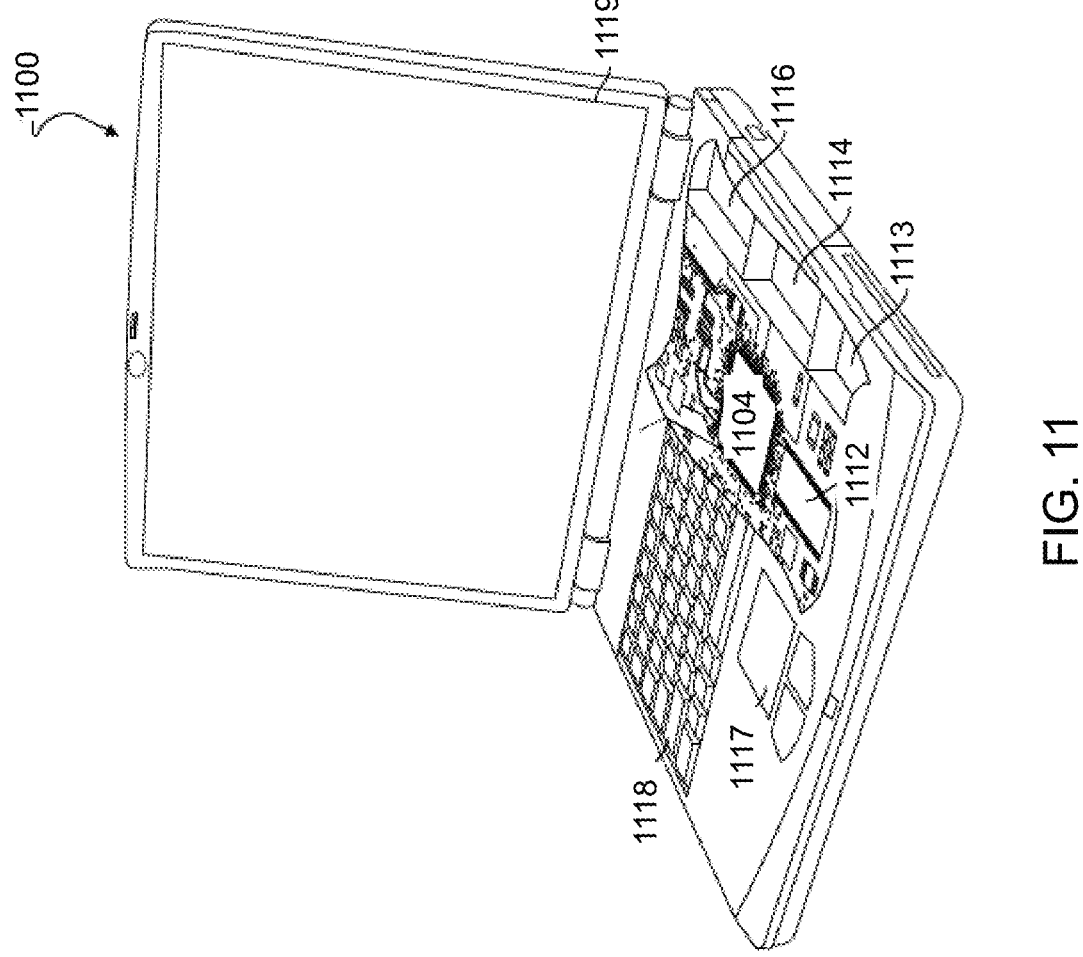
FIG. 11 is a component block diagram of an example computing device suitable for use with the various embodiments.

Various example methods (including, but not limited to, the examples discussed above with reference to FIGS. 8-10), may be implemented within a variety of personal computing devices, an example 1100 of which is illustrated in FIG. 11. With reference to FIGS. 8-10, the laptop computer 1100 may include a touchpad touch surface 1117 that serves as the computer's pointing device, and thus may receive drag, scroll, and flick gestures similar to those implemented on wireless computing devices equipped with a touchscreen display and described above. A laptop computer 1100 will typically include a processor 1104 coupled to volatile memory 1112 and a large capacity nonvolatile memory, such as a disk drive 1113 of Flash memory. The computer 1100 may also include a floppy disc drive 1114 and a compact disc (CD) drive 1116 coupled to the processor 1104. The computer 1100 may also include a number of connector ports coupled to the processor 1104 for establishing data connections or receiving external memory devices, such as a Universal Serial Bus (USB) or Fire Wire® connector sockets, or other network connection circuits for coupling the processor 1104 to a network. In a notebook configuration, the computer housing includes the touchpad 1117, the keyboard 1118, and the display 1119 all coupled to the processor 1104. Other configurations of the computing device may include a computer mouse or trackball coupled to the processor (e.g., via a USB input) as are well known, which may also be used in conjunction with various examples.

Figure 12:
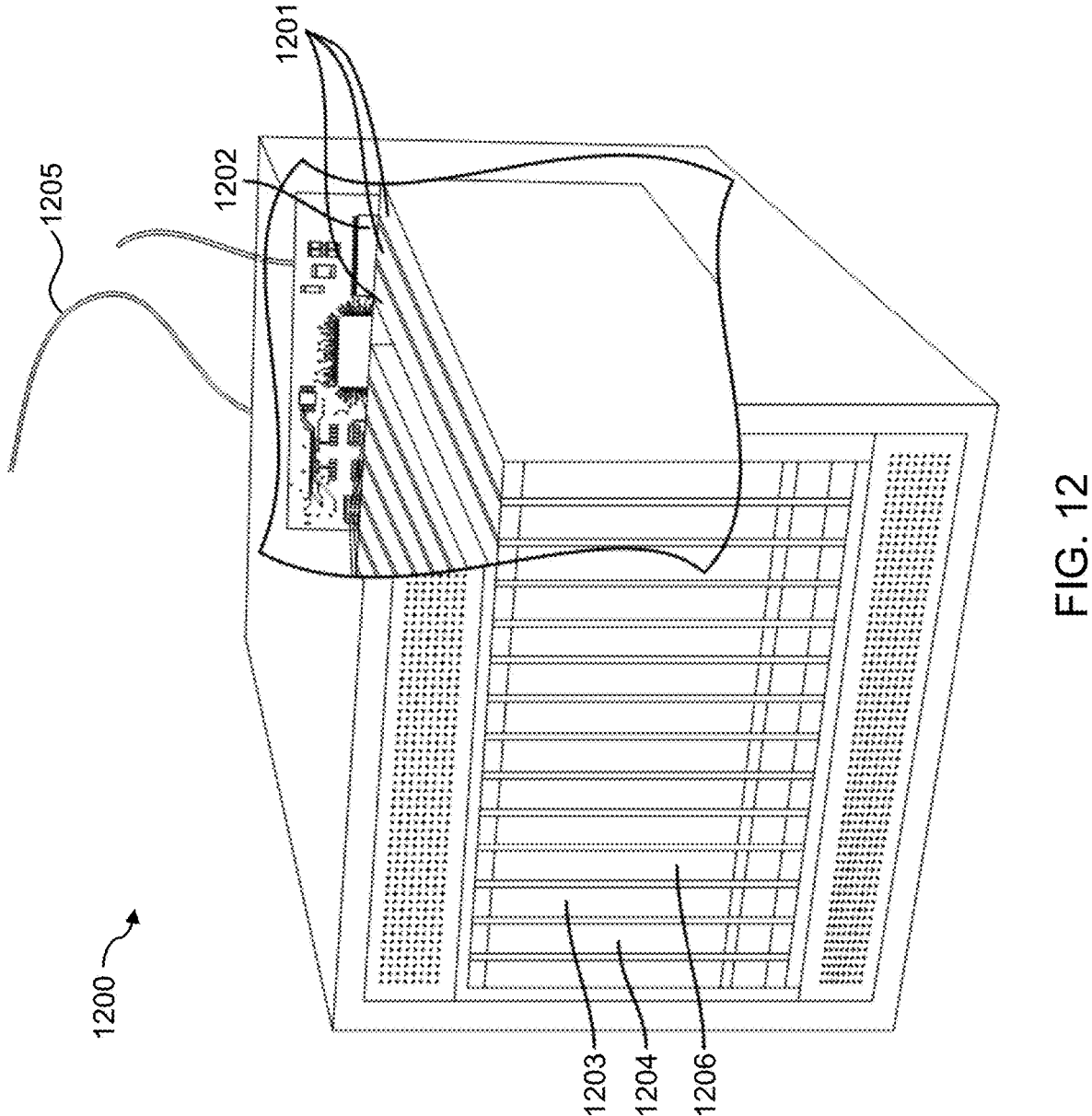
FIG. 12 is a component block diagram illustrating an example server suitable for use with the various embodiments.

Various example methods (including, but not limited to, the examples discussed above with reference to FIGS. 8-10) may also be implemented in fixed computing systems, such as any of a variety of commercially available servers. An example server 1200 is illustrated in FIG. 12. Such a server 1200 typically includes one or more multicore processor assemblies 1201 coupled to volatile memory 1202 and a large capacity nonvolatile memory, such as a disk drive 1204. As illustrated in FIG. 12, multicore processor assemblies 1201 may be added to the server 1200 by inserting them into the racks of the assembly. The server 1200 may also include a floppy disc drive, compact disc (CD) or digital versatile disc (DVD) disc drive 1206 coupled to the processor 1201. The server 1200 may also include network access ports 1203 coupled to the multicore processor assemblies 1201 for establishing network interface connections with a network 1205, such as a local area network coupled to other broadcast system computers and servers, the Internet, the public switched telephone network, and/or a cellular data network.

With reference to FIGS. 8-10, the processors 1104, 1201 may be any programmable microprocessor, microcomputer or multiple processor chip or chips that can be configured by software instructions (applications) to perform a variety of functions, including the functions of various examples described above. In some devices, multiple processors may be provided, such as one processor dedicated to wireless communication functions and one processor dedicated to running other applications. Typically, software applications may be stored in the internal memory, 1112, 1113, 1202 before they are accessed and loaded into the processors 1104, 1201. The processors 1104, 1201 may include internal memory sufficient to store the application software instructions. In many devices the internal memory 1112, 1113, 1202 may be a volatile or nonvolatile memory, such as flash memory, or a mixture of both. For the purposes of this description, a general reference to memory refers to memory accessible by the processors 1104, 1201, including internal memory 1112, 1113, 1202 or removable memory plugged into the device and memory 1112, 1202 within the processors 1104, 1201, themselves.

Generally, the bonding apparatus 1000 of the present disclosure may be used to implement a fluxless thermocompression bonding process while ensuring that metal oxides are not present on bonding surfaces. The various infrared cameras may be used to detect presence of residual metal oxide by generating at least one infrared image of the solder material portions 30 and the package-side bonding structures 28. In some embodiments, multiple infrared images of a same metallic surface may be generated at different infrared wavelengths to facilitate identification of areas of metal oxide. Upon detection of metal oxide, additional plasma clean process or an inspection process may be performed as a remedial measure.

The various embodiments of the present disclosure may be used to improve the process yield of the bonding processes, to increase the process windows for the bonding operation, and to increase the reliability of the bonded assembly of a semiconductor die 10 and a packaging substrate 20.

The foregoing outlines features of several embodiments so that those skilled in the art may better understand the aspects of the present disclosure. Each embodiment described using the term "comprises" also inherently discloses additional embodiments in which the term "comprises" is replaced with "consists essentially of" or with the term "consists of," unless expressly disclosed otherwise herein. Whenever two or more elements are listed as alternatives in a same paragraph of in different paragraphs, a Markush group including a listing of the two or more elements is also impliedly disclosed. Whenever the auxiliary verb "can" is used in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a bonded assembly, the method comprising:
performing a chip plasma clean process on a semiconductor chip in a low-oxygen ambient;
generating at least one chip infrared image of a cleaned side of the semiconductor chip;
measuring an average emissivity of at least one metallic region in the at least one chip infrared image; and
performing a subsequent processing step selected from a bonding step and an alternative processing step based on the measured average emissivity, wherein:
the bonding step is performed in response to determining that the measured average emissivity is less than a predetermined emissivity threshold value and bonds the semiconductor chip to a packaging substrate, and
the alternative processing step is performed in response to determining that measured average emissivity is greater than the predetermined emissivity threshold value, the alternative processing step being selected from an additional clean step and an additional inspection step.

2. The method of claim 1, wherein:
the semiconductor chip comprises an array of chip-side bonding structures;
an array of solder material portions are attached to the array of chip-side bonding structures; and the at least one metallic region in the at least one chip infrared image comprises an image of one of the array of solder material portions.

3. The method of claim 2, wherein the chip plasma clean process directs a plasma jet generated by at least one chip plasma treatment system having a respective plasma nozzle that is directed to the cleaned side of the semiconductor chip.

4. The method of claim 1, wherein the at least one chip infrared image of the cleaned side of the semiconductor chip is generated using a chip infrared camera located within the low oxygen ambient.

5. The method of claim 4, wherein the chip infrared camera has a field of view that includes an entire area of the cleaned side of the semiconductor chip.

6. The method of claim 4, where the measured average emissivity is measured using an image analysis program that:
identifies a plurality of metallic regions within the at least one chip infrared image,
calculates emissivity values for each of the plurality of metallic regions, and
calculates an average of the emissivity values for the plurality of metallic regions within the at least one chip infrared image.

7. The method of claim 4, wherein the chip infrared camera generates the at least one chip infrared image by using optical input having a wavelength range between 2 microns to 30 microns.

8. The method of claim 1, further comprising:
providing a wafer including a plurality of packaging substrates, the plurality of packaging substrates including the packaging substrate;
performing a wafer plasma clean process on the wafer in the low-oxygen ambient or another low-oxygen ambient; and
performing the bonding step after the wafer plasma clean process.

9. The method of claim 8, wherein:
the plurality of packaging substrates comprises an array of organic interposers;
an organic interposer within the array of organic interposers comprises a respective array of substrate-side bonding structures; and
the wafer plasma clean process cleans the respective array of substrate-side bonding structures within the wafer.

10. The method of claim 1, wherein the predetermined emissivity threshold value is in a range from 0.05 to 0.30.

11. A method of forming a bonded assembly, the method comprising:
providing a wafer including a plurality of packaging substrates;
performing a wafer plasma clean process on the wafer in a low-oxygen ambient having an oxygen partial pressure that is lower than 17 kPa;
generating at least one wafer infrared image of a cleaned side of the wafer;
measuring an average emissivity of at least one metallic region in the at least one wafer infrared image; and
performing a subsequent processing step selected from a bonding step and an alternative processing step based on the measured average emissivity,
wherein the bonding step is performed in response to determining that the measured average emissivity is less than a predetermined emissivity threshold value and bonds at least one semiconductor chip to a respective one of the packaging substrate in the wafer, and the alternative processing step is performed in response to determining that the measured average emissivity is greater than the predetermined emissivity threshold value, the alternative processing step being selected from an additional clean step and an additional inspection step.

12. The method of claim 11, wherein:

a packaging substrate within the plurality of packaging substrates comprises a respective array of substrate-side bonding structures; and the at least one metallic region in the at least one wafer infrared image comprises an image of one of the substrate-side bonding structures of the packaging substrate.

13. The method of claim 12, wherein the wafer plasma clean process directs a plasma jet generated by at least one plasma treatment system having a respective plasma nozzle that is directed to the cleaned side of the wafer.

14. The method of claim 11, wherein the at least one wafer infrared image of the cleaned side of the wafer is generated using a wafer infrared camera located within the low oxygen ambient.

15. The method of claim 14, wherein the wafer infrared camera and the wafer move relative to each other, and the wafer infrared camera generates a plurality of wafer infrared images as the at least one wafer infrared image.

16. The method of claim 11, further comprising:

a first step of performing a chip plasma clean process on a semiconductor chip in the low-oxygen ambient or another low-oxygen ambient;

a second step of generating at least one chip infrared image of a cleaned side of the semiconductor chip; and a third step of using the semiconductor chip as one of the at least one semiconductor chip in response to determining that a measured average emissivity of at least one metallic region in the at least one chip infrared image is below an additional predetermined emissivity threshold value, or performing the first step and the second step with another semiconductor chip in response to determining that the measured average emissivity of at least one metallic region in the at least one chip infrared image is below the additional predetermined emissivity threshold value.

17. A method of forming a bonded assembly, the method comprising:

performing a wafer plasma clean process on a wafer including a plurality of packaging substrates in a low-oxygen ambient;

generating at least one wafer infrared image of a cleaned side of the wafer;

measuring an average emissivity of at least one metallic region in the at least one wafer infrared image; and performing a subsequent processing step selected from a bonding step and an alternative processing step based on the measured average emissivity, wherein the bonding step is performed in response to determining that the measured average emissivity is less than a predetermined emissivity threshold value and bonds at least one semiconductor chip to a respective one of the packaging substrates in the wafer, and the alternative processing step is performed in response to determining that the measured average emissivity is greater than the predetermined emissivity threshold value.

18. The method of claim 17, wherein:

a packaging substrate within the plurality of packaging substrates comprises a respective array of substrate-side bonding structures; and the at least one metallic region in the at least one wafer infrared image comprises an image of one of the substrate-side bonding structures of the packaging substrate.

19. The method of claim 18, wherein the wafer plasma clean process directs a plasma jet generated by at least one plasma treatment system having a respective plasma nozzle that is directed to the cleaned side of the wafer.

20. The method of claim 17, wherein the at least one wafer infrared image of the cleaned side of the wafer is generated using a wafer infrared camera located within the low oxygen ambient.

* * * * *